US009065016B2

(12) United States Patent
Peter et al.

(10) Patent No.: US 9,065,016 B2
(45) Date of Patent: Jun. 23, 2015

(54) METHOD FOR MANUFACTURING A THERMOELECTRIC GENERATOR

(75) Inventors: Maria Peter, Eindhoven (NL); Erwin Rinaldo Meinders, Veldhoven (NL); Ruud Vullers, Eindhoven (NL)

(73) Assignee: NEDERLANDSE ORGANISATIE VOOR TOEGEPAST-NATUURWETENSCHAPPELIJK ONDERZOEK TNO (NL)

( * ) Notice: Subject to any disclaimer, the term of this patent is extended or adjusted under 35 U.S.C. 154(b) by 1238 days.

(21) Appl. No.: 12/995,662

(22) PCT Filed: Jun. 2, 2009

(86) PCT No.: PCT/NL2009/050304
§ 371 (c)(1),
(2), (4) Date: Mar. 16, 2011

(87) PCT Pub. No.: WO2009/148309
PCT Pub. Date: Dec. 10, 2009

(65) Prior Publication Data
US 2011/0154558 A1    Jun. 30, 2011

(30) Foreign Application Priority Data
Jun. 2, 2008    (EP) .................................... 08157445

(51) Int. Cl.
*H01K 3/10*    (2006.01)
*H01L 35/34*    (2006.01)
*H01L 35/32*    (2006.01)

(52) U.S. Cl.
CPC ........... *H01L 35/34* (2013.01); *Y10T 29/49165* (2015.01); *H01L 35/32* (2013.01)

(58) Field of Classification Search
CPC ... H01L 35/34; H01L 35/32; Y10T 29/49155; Y10T 29/49163; Y10T 29/49165
USPC ............ 29/846, 851, 852; 136/201, 203, 205, 136/225; 216/18; 438/48, 54
See application file for complete search history.

(56) References Cited

U.S. PATENT DOCUMENTS 5,837,929 A    11/1998 Adelman
5,875,098 A    2/1999 Leavitt et al.
(Continued)

FOREIGN PATENT DOCUMENTS

DE    10 2006 017 547 A1    10/2007
EP    1 840 980 A1    10/2007
(Continued)

OTHER PUBLICATIONS

Jung, Stefan, et al., "Elektronik Zum Anziehen Wearable Electronics: Basis-Technologien Fuer Die Intelligente Kleidung," Elektronik, Weka Fachzeitschriftenverlag, Poing, DE, vol. 15, No. 12, pp. 40-43 (Jun. 11, 2002).

*Primary Examiner* — Donghai D Nguyen
(74) *Attorney, Agent, or Firm* — Kilpatrick Townsend & Stockton LLP

(57) ABSTRACT

A method for manufacturing a thermoelectric generator includes the steps of replicating a structure into a flexible substrate for providing a set of cavities; providing an initiator in the cavities for growing respective piles of thermoelectric materials; growing the respective piles of thermoelectric materials from said initiator; and providing electrical connection between the respective piles of thermoelectric materials for forming thermocouples of the thermoelectric generator.

10 Claims, 6 Drawing Sheets

(56) References Cited

U.S. PATENT DOCUMENTS

| | | | |
|---|---|---|---|
| 6,127,619 A * | 10/2000 | Xi et al. | 136/203 |
| 7,189,435 B2 * | 3/2007 | Tuominen et al. | 216/18 |
| 8,378,206 B2 * | 2/2013 | Schuette et al. | 136/225 |
| 2002/0119251 A1 | 8/2002 | Chen et al. | |
| 2002/0158342 A1 | 10/2002 | Tuominen et al. | |
| 2003/0211797 A1 | 11/2003 | Hill et al. | |
| 2006/0102223 A1 | 5/2006 | Chen et al. | |
| 2008/0121263 A1 | 5/2008 | Schutte et al. | |
| 2008/0160177 A1 | 7/2008 | Mataybas et al. | |

FOREIGN PATENT DOCUMENTS

| | | |
|---|---|---|
| JP | 6-338636 A | 12/1994 |
| JP | 2004-140064 A | 5/2004 |
| WO | WO 99/65086 A1 | 12/1999 |
| WO | WO 00/79023 A1 | 12/2000 |

* cited by examiner

METHOD FOR MANUFACTURING A THERMOELECTRIC GENERATOR

CROSS-REFERENCES TO RELATED APPLICATIONS

This application is a National Stage of International Application No. PCT/NL2009/050304, filed Jun. 2, 2009, and which claims the benefit of European Patent Application No. 08157445.1, filed Jun. 2, 2008, the disclosures of which are incorporated herein by reference.

FIELD

The invention relates to a method for manufacturing a thermoelectric generator. The invention further relates to a wearable thermoelectric generator and a garment comprising the same.

BACKGROUND OF THE INVENTION

Thermoelectric generators are known per se and are used to produce power by converting thermal energy directly into electricity. For a reasonable performance it is desired that one thermoelectric generator comprises at least a hundred pairs of electrically connected thermocouples comprising piles of a p type material and an n type material. Usually the thermocouples are electrically connected in series, whereby the piles are structured between two substantially parallel surfaces.

A method for manufacturing a thermoelectric generator is known from U.S. Pat. No. 5,897,330. The known method comprises steps of forming a stripe-shaped pattern on a substrate using photolithography of a photosensitive resist followed by a step of providing a polymer film on the underside of the substrate for forming first thermoelectric bodies and second thermoelectric bodies, coating the first thermoelectric bodies and the second thermoelectric bodies with a thermosetting resist followed by dissolving the substrate and the electrode film thereafter.

It is a disadvantage of the known method that piles of the thermocouples are fully formed and produced by a complicated and expensive photolithography method. It is a further disadvantage of the known method that an aspect ratio of the piles is limited due to inherent limitations of photolithography.

SUMMARY OF THE INVENTION

It is an object of the invention to provide a method for manufacturing a thermoelectric generator which is reliable yet not expensive. In addition, it is an object of the invention to provide a method for manufacturing a thermoelectric generator wherein high aspect ratios for the thermocouple piles are obtainable. It is a further object of the invention to provide substantially large area thermoelectric generators.

To this end the method for manufacturing a thermoelectric generator according to the invention comprises the steps of;
- mechanically replicating a structure into a flexible substrate for providing a set of cavities;
- providing an initiator in the cavities for growing respective piles of thermoelectric materials;
- growing the respective piles of thermoelectric materials from said initiator;
- providing electrical connection between the respective piles of thermoelectric materials for forming thermocouples of the thermoelectric generator.

It is found that by utilizing a suitable mechanical replication technique, for example imprinting or embossing a suitable structure for forming piles of the thermocouples may be reliably produced with low production costs. It will be appreciated that although the mechanical replication technique is applied to a flexible substrate, use of a rigid substrate is also contemplated. In case when for the substrate a flexible substrate is selected, the method according to the invention has an advantage that lightweight thermoelectric generators are provided which may conform to an object having a non-planar shape. It is further found that mechanical replication techniques enable production of microstructures having high aspect ratios, which is particularly advantageous in the field of micro fluidics and microelectronics and in particular in micro thermoelectric generators.

When for forming thermocouple piles a flexible substrate is selected, also an advantageous relaxation of conditions of the manufacturing process is obtained. Due to the fact that flexible substrates usually have low thermal conductivity, it makes them suitable materials for enabling deposition of thermoelectric materials for forming the thermocouples. In addition, use of flexible substrates facilitates a low-temperature production. It is found that the manufacturing process according to the invention may be carried-out with temperatures comparable with a room temperature, in particular with temperatures within the range of 18-25° C., which is substantially less than processing and/or deposition temperatures of about 200° C.-1000° C. used in the field of thermoelectric semiconductors, for example using $Bi_2Te_3$ or $Sb_2Te_3$, doped SiGe, or such. It will be appreciated that for providing a thermocouple a pile of an n-type material is electrically connected with a pile of a p-type material thus forming a thermocouple.

Preferably, the step of growing the respective piles from the initiator comprises either electrochemical deposition or electroless deposition. These techniques have advantage of being realizable for growing piles in a polymer substrate under the room temperature, or about the room temperature.

In an embodiment of the method according to the invention, the step of providing the initiator comprises depositing respective metal seeds in the cavities.

Preferably, seeds of a first thermoelectric material in a first set of cavities are provided, after which seeds of a second thermoelectric material in a second set of cavities are provided, whereby cavities from the first set of cavities are alternated with cavities from the second set of cavities. A plurality of suitable techniques may be used for depositing the seeds. For example, the seeds may be deposited using ink-jet printing, spin-coating, or, alternatively, they may be deposited through a mask. In addition, nano- or micro-machined surfaces having different wetting properties may be used as respective bases for selectively depositing seeds in specific areas. This may further improve functionality of the thus produced thermoelectric generator.

In an alternative embodiment of the method according to the invention, for the flexible substrate a metal coated flexible substrate is selected, whereby the step of providing the initiator comprises removing a residual substrate material between respective cavities and the metal.

This embodiment is based on the insight that when the cavities are being mechanically replicated in the substrate, areas of residual material remain between a lower surface of the cavity and the metal. In order to facilitate pile growing from the metal, the residual material between the metal and the bottom of the cavities has to be removed. For example, for removing of the residual substrate material a UV-transparent of a light-transparent mask may be used. Also dry plasma etching through mask or photoresist mask can be used. It will be appreciated that a similar removal of residual substrate material may be applied for rigid substrates.

Alternatively, it is possible that a metal layer on the substrate is pre-patterned prior to defining cavities in the substrate yielding a suitable sequence of metal islands underlying a set of cavities. The islands may be shaped to define at least respective bases of the piles to be grown. Preferably, the islands also provide electrical interconnection between the bases of the piles.

It will be appreciated that the term 'substrate' relates to any suitable material wherein cavities are to be formed. It is possible that the substrate is homogeneous, or, alternatively, comprises two or more layers of different materials. Next to this, it is also possible that the substrate is provided on a supplementary support layer, which is conceived to be at least partially removed during manufacturing of the thermoelectric generator. Preferably, the substrate comprises a polymer. Polymers have advantage of being shapeable with high aspect ratio patterns and/or with high density patterns. In addition, a polymer substrate may be provided as a flexible foil. By using a foil, it is possible to provide thermoelectric generators on large areas, for example dimensions up to 300 mm are obtainable. More preferably, the polymer is UV curable or thermally curable. More preferably, the polymer comprises an elastomeric material. Use of elastomeric material has a particular advantage when the thermoelectric generator is implemented as a wearable device, because an elastic polymer may be selected with a required degree of flexibility and stretchability for suiting an envisaged application. For example, such wearable thermoelectric generator may form part of an energy harvesting system wherein a body heat is transferred into electricity. In general, the following materials are suitable for use as the substrate—Polyethylene terephthalate (PET), polyethylene naphthalate (PEN), polyimide (PI), polycarbonate (PC), polyethersulphone (PES), polymethyl metacrylate (PMMA), polydimethylsiloxane (PDMS), polyurethane (PU), acrylate based polymers, and so on. It is found that in case when such thermoelectric generator is flexible and thereby in use substantially conforms to a shape of a body part it is cooperating with, efficiency of energy harvesting is substantially increased.

In accordance with a further embodiment of the invention for replication purposes a suitable mold or an embossing unit may be used, which may easily be adapted for providing suitable aspect ratios on demand. In this way limitations of photolithography with respect to obtainable aspect ratio of the thermocouple piles are overcome. In addition the mold may be re-used during mass production, further reducing production costs. Roll-to-roll manufacturing is also possible, which may lead to a further reduction of manufacturing costs.

It is further found that, in particular, height and the number of thermocouples per thermoelectric generator may be crucial for a reliable performance of the thermoelectric generator. The number of thermocouples per area may be increased by reducing cross-section of the piles, however not further than a minimum cross-section of a few micrometers. In order to increase the aspect ratio of the thermocouple piles the height of the piles may be increased. It is found that replication techniques enable a substantial increase of obtainable pile heights with respect to lithographic methods, as lithographic methods are limited by either thickness of the resist, or imaging parameters.

An alternative embodiment of the method for manufacturing a thermoelectric generator according to the invention comprises the steps of;

mechanically replicating a structure into a flexible substrate for providing a set of cavities;
    using a first mask for depositing a layer of a first thermoelectric material on first surfaces of the cavities;
    using a second mask for depositing a layer of a second thermoelectric material on second surfaces of the cavities in electrical contact with the layer of the first thermoelectric material.

This method has advantage of a low-cost replication method, wherein the piles may be provided by consecutive evaporating of a suitable thermocouple material through a mask or by tilt-angle evaporation. Alternatively, for a substantially horizontally oriented substrate, walls of the cavities may be oblique with respect to a vertical line. For the thermocouple material either thermoelectric metals or semiconductor materials may be used. Preferably, the first surfaces comprise at least respective first side walls of the cavities and the second surfaces comprise at least second side walls of the cavities. In this case the high aspect ratio may easily be obtained because instead of forming respective thermocouple piles the cavity walls are used for supporting thermoelectric materials. Preferably, for mechanical replication either imprinting or embossing is used.

In accordance with a further alternative embodiment of the method for manufacturing a thermoelectric generator according to the invention, a substrate comprising a set of thermocouples is provided on a further substrate comprising a cold region and a hot region for the thermocouples yielding a thermoelectric generator. In this case the cavities of a replicated substrate, which can either be a plastic substrate, or a plastic substrate provided with an imprint resist polymer on top, bearing similar properties of the substrate as described above, may be used to deposit an electrically conductive material within the cavities. Such material may serve as a cold region and/or a hot region and at the same time may serve as an electrical connector between the n type and the p type piles forming the thermocouples. The cold regions and the hot regions may play a role of assuring a correct heat-flow direction through the thermocouples. It will be appreciated that a region may relate to a two-dimensional or a three-dimensional object. The substrate is preferably mechanically replicated, for example, by means of imprinting or embossing.

Preferably, a first plurality of the thermocouples is connected to a mutual cold region and a second plurality of thermocouples is connected to a mutual hot region, thermocouples forming the first plurality being interleaved with thermocouples forming the second plurality.

In a further embodiment of the method according to the invention, the method further comprises a step of superposing the thermoelectric generator with a further substrate provided with a hot region so that the thermocouples are sandwiched between the hot region and further a cold region, each pile of a thermocouple being connected to the cold region and the hot region. It is noted that the cold region may be of the same or of a different type than the hot region.

Preferably, the substrate comprising the thermocouples is manufactured in accordance with the method comprising replication followed by pile growing, or replication followed by surface layer forming on the cavities' walls, as described with reference to the foregoing.

A still further alternative method for manufacturing a thermoelectric generator according to the invention, comprises the steps of providing a first type of thermoelectric material on a first substrate comprising a first set of hot regions and cold regions;

providing a second type of thermoelectric material on a second substrate comprising a second set of hot regions and cold regions;

joining the first substrate and the second substrate for forming a set of thermocouples, wherein each type of thermoelectric material is connected to the hot region and the cold region.

This method provides still further simple means for manufacturing a thermoelectric generator provided with a cold region and the hot region.

The invention further relates to a wearable thermoelectric generator according to the invention, which may advantageously be manufactured by any method discussed with reference to the foregoing. Preferably, the wearable relates to a band conceived to put about an extremity. It is also possible that the wearable relates to a suitable utility item, for example a watch, an arm band, a snood or band wearable on a person's head or the like. The thermoelectric generator may be laminated on a surface of the wearable. Alternatively, the thermoelectric generator may be integrated into a substance of the wearable, for example it may form part of said substance.

It will be appreciated that in either embodiment of the method of manufacturing a thermoelectric generator, respective piles of the thermoelectric material may be provided using the seed-growing technique as is described in the foregoing.

A garment according to the invention comprises the wearable thermoelectric generator, described above. The garment may relate to any suitable item, for example an underwear piece, a sock, or the like. Alternatively, the garment may relate to a dedicated wearable, like a sport suit, a combat suit, or the like.

These and other aspects of the invention will be further discussed with reference to drawings wherein like reference numerals represent like elements. It will be appreciated that drawings are presented for illustrative purposes only and may not be used for limiting the scope of the appended claims.

DETAILED DESCRIPTION OF THE DRAWINGS

Figure 1:
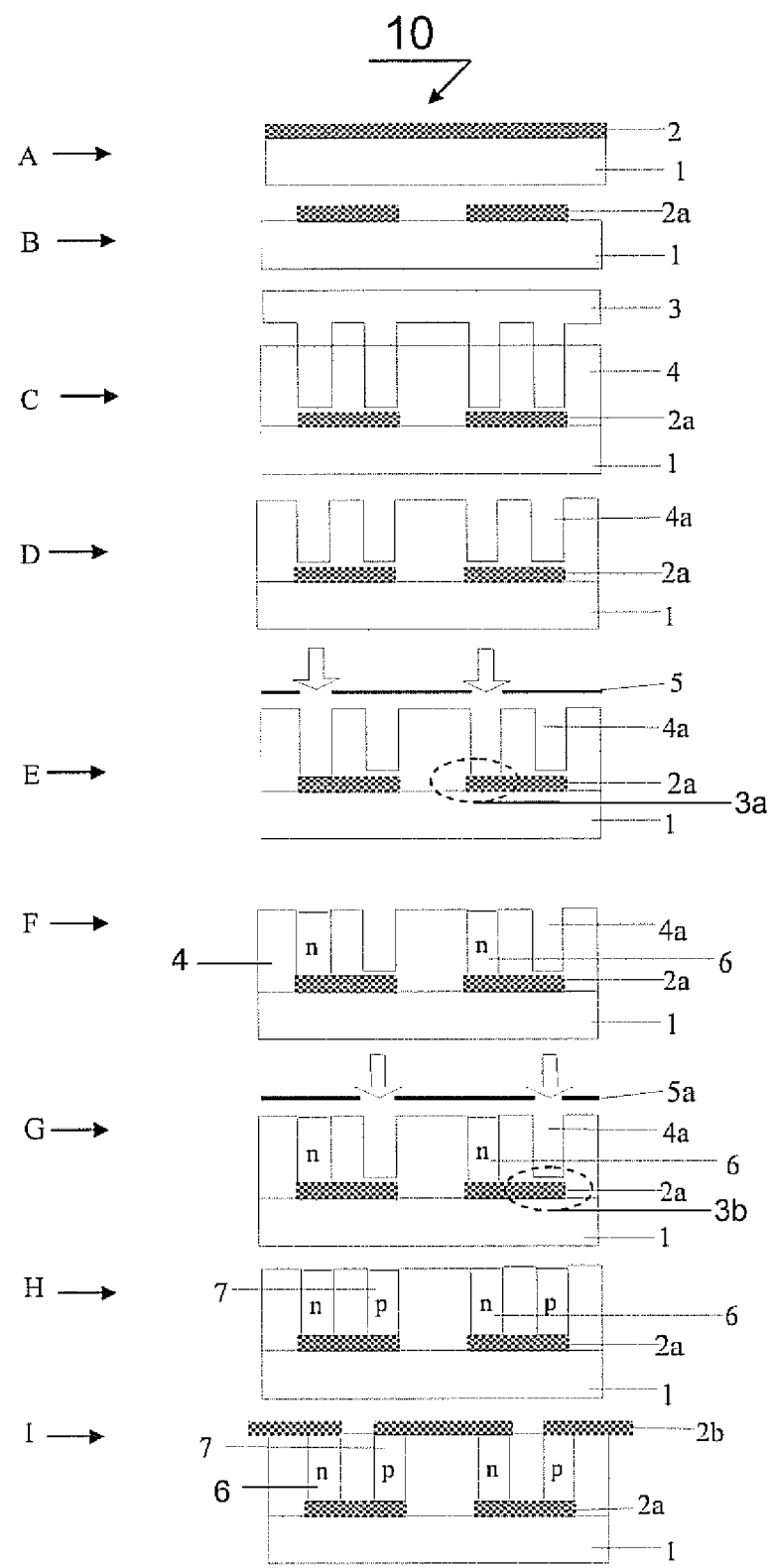
FIG. 1 presents in a schematic way a first embodiment of the method according to the invention.

FIG. 1 presents in a schematic way a first embodiment of the method 10 according to the invention. A metal layer 2 may be provided on a suitable supporting substrate 1 (see step A). The metal layer 2 is pre-patterned to yield islands 2a (see step B), for example by photolithography for defining electrode structures for electroless deposition (ELD) or electrochemical deposition of the piles. Next, a layer of a suitable polymeric layer or foil 4 is deposited on substrate 1 with the metal islands 2a. Layer 4 is patterned (provided with cavities) by mechanically pushing stamp (imprinting) 3 into layer 4. Alternatively, the metal layer 2 may be deposited on the polymer foil 4 and then patterned to yield islands 2a. In this case the supporting substrate 1 may be not required. The piles of the thermoelectric generator are conceived to be grown in the cavities, which may be defined by embossing or imprinting the structures in the polymer foil 4, using a suitable tool 3 (see step C). As a result a set of cavities 4a is provided, the cavities having well-defined lateral sizes (see step D).

The metal islands 2a are used as initiator for growing piles of the thermocouples. In order to facilitate such growth, first a residual substrate material in areas 3a has to be removed. The substrate 4 may relate to a thermally (at low temperature) or UV curable polymer resist. The residual material in the region 3a may be removed by using a mask 5 (see step E), which may be transparent to UV or light. The residual layer 3a after may be at least partially removed using illumination or plasma through the mask 5.

After the metal islands 2a are partially revealed a pile growing may commence. A polymer material is preferably chosen such that it does not dissolve in an electrolyte used for electroless deposition (ELD) or electrochemical deposition of the piles. The polymer can be elastomeric material to assure the flexibility of the device after fabrication. The patterned polymer 4 may serve as template for the electroless deposition of the thermocouples and may be kept in the thermoelectric generator for preventing the thermocouples from collapsing.

One of the thermoelectric materials 6 (e.g. copper or n (either p) type thermoelectric semiconductor) may be deposited by electroless or electrochemical deposition on the electrode areas where the residual layer of material was removed (see step F). In a consecutive step the remaining cavities are freed from the polymer residual layer 3b using mask 5a and the other type of thermoelectric material (e.g. nickel) may be grown by ELD or by electrochemical deposition (see steps G en H). The manufacturing process may be completed by connecting the couples 6, 7 on the top by metal deposition followed by a lithography step in such a way to have overall a serial electrical connection of piles 6, 7, having different type (n, p) of thermoelectric material (see step I). Due to this production method low-cost manufacturing of thermoelectric generators having large surface areas, for example up to a square meter, or even larger is enabled.

It is also possible to envisage a structure of the cavities wherein air gaps are provided between respective cavities; as such cavities have low thermal conductivities, which is advantageous for operation of the thermoelectric generator.

Figure 2:
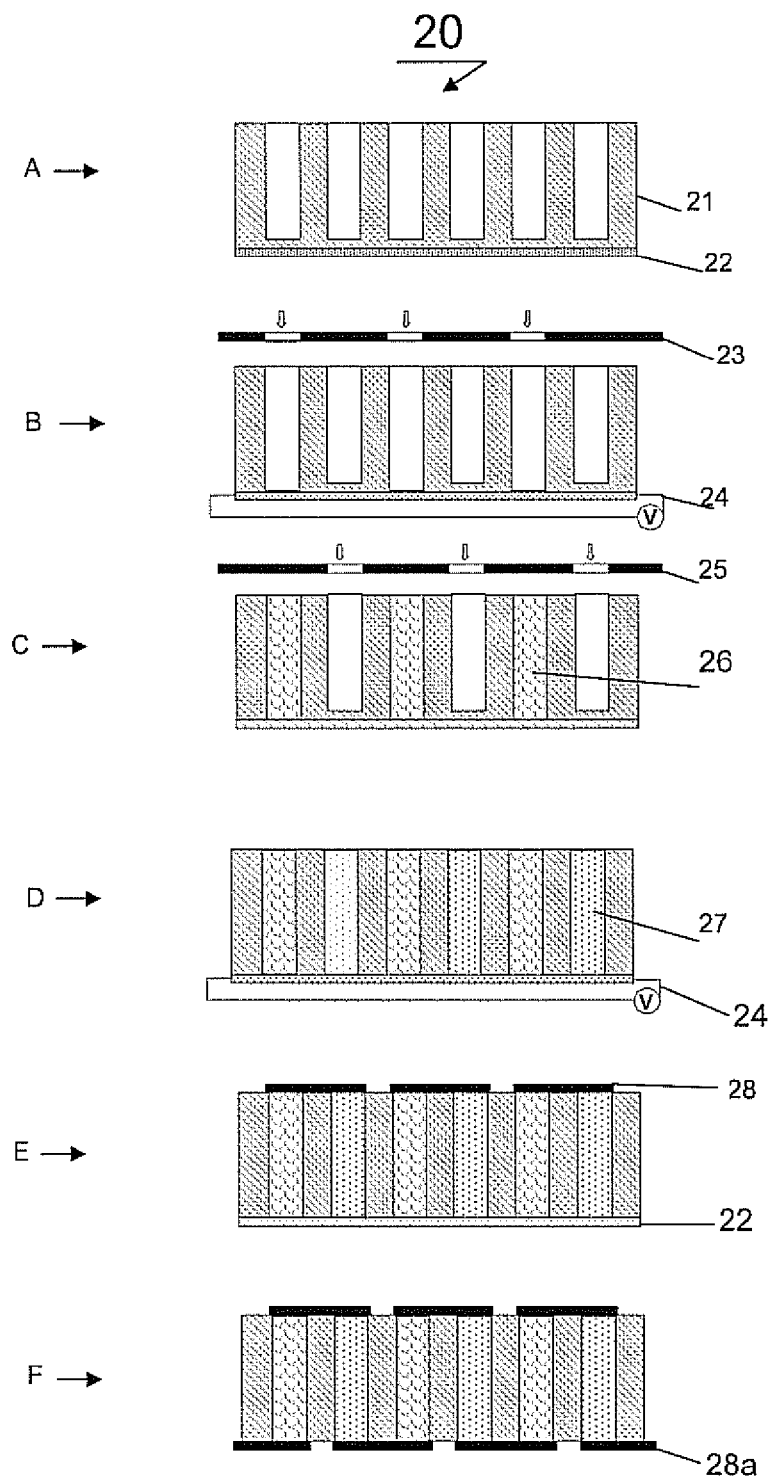
FIG. 2 presents in a schematic way a second embodiment of the method according to the invention.

FIG. 2 presents in a schematic way a second embodiment of the method 20 according to the invention. In this embodiment of the method according to the invention, it can be envisaged the use of a non-patterned metal coated foil 22 followed by a deposition of a polymer resist, which subsequently undergoes a suitable replication step yielding a set of cavities 21 (see step A). The metal foil serves as the initiator. The steps B-F may correspond to the steps E-I of FIG. 1. After a removal of a residual layer is carried out, the metal layer will be revealed and will serve as an electrode for the electrochemical deposition (ECD) of semiconductor (e.g. n-type $Bi_2Te_3$, or p-type $Sb_2Te_3$) or other thermoelectric material from classical electrolyte or from an ionic liquid. After the thermocouples are deposited (see step D), the metal foil 22 may be removed from the piles 26, 27 embedded in the substrate 21, and the electrical connectors 28, 28a may be made in the supplementary steps E, F. The structure yielded at step F may later be laminated onto flexible plastic foil.

Figure 3:
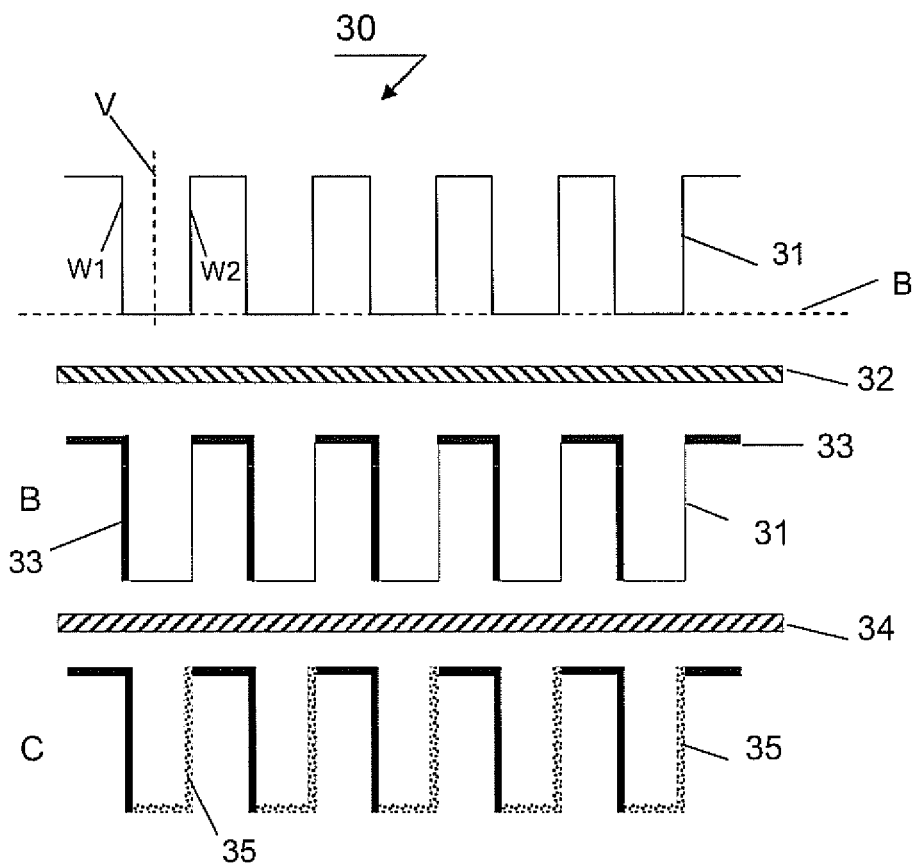
FIG. 3 presents in a schematic way a third embodiment of the method according to the invention.

FIG. 3 presents in a schematic way a third embodiment of the method 30 according to the invention. In this embodiment two different components 33, 35 of the thermocouples (metal or semiconductor) may be deposited on respective walls of a set of cavities 31, replicated in a suitable substrate. Also in this embodiment use of rigid or flexible substrate is contemplated.

For example, a first mask 32 may be used for depositing a layer of a first thermoelectric material 33 on first surfaces of the cavities; a second mask 35 may be used for depositing a layer of a second thermoelectric material on second surfaces 35 of the cavities in electrical contact with the layer of the first thermoelectric material. It is possible that a step of depositing a layer is performed using a tilt-angle deposition. Alternatively, for a horizontal orientation of a base B of the substrate 31, walls W1, W2 of the cavities may obliquely propagate with respect to a vertical line V. In this case; after the thermoelectric materials are deposited on the walls, the different n or p type material in the cavities can be separated by air. This has an advantage that the n and p type materials are better thermally isolated from each other.

Figure 4:
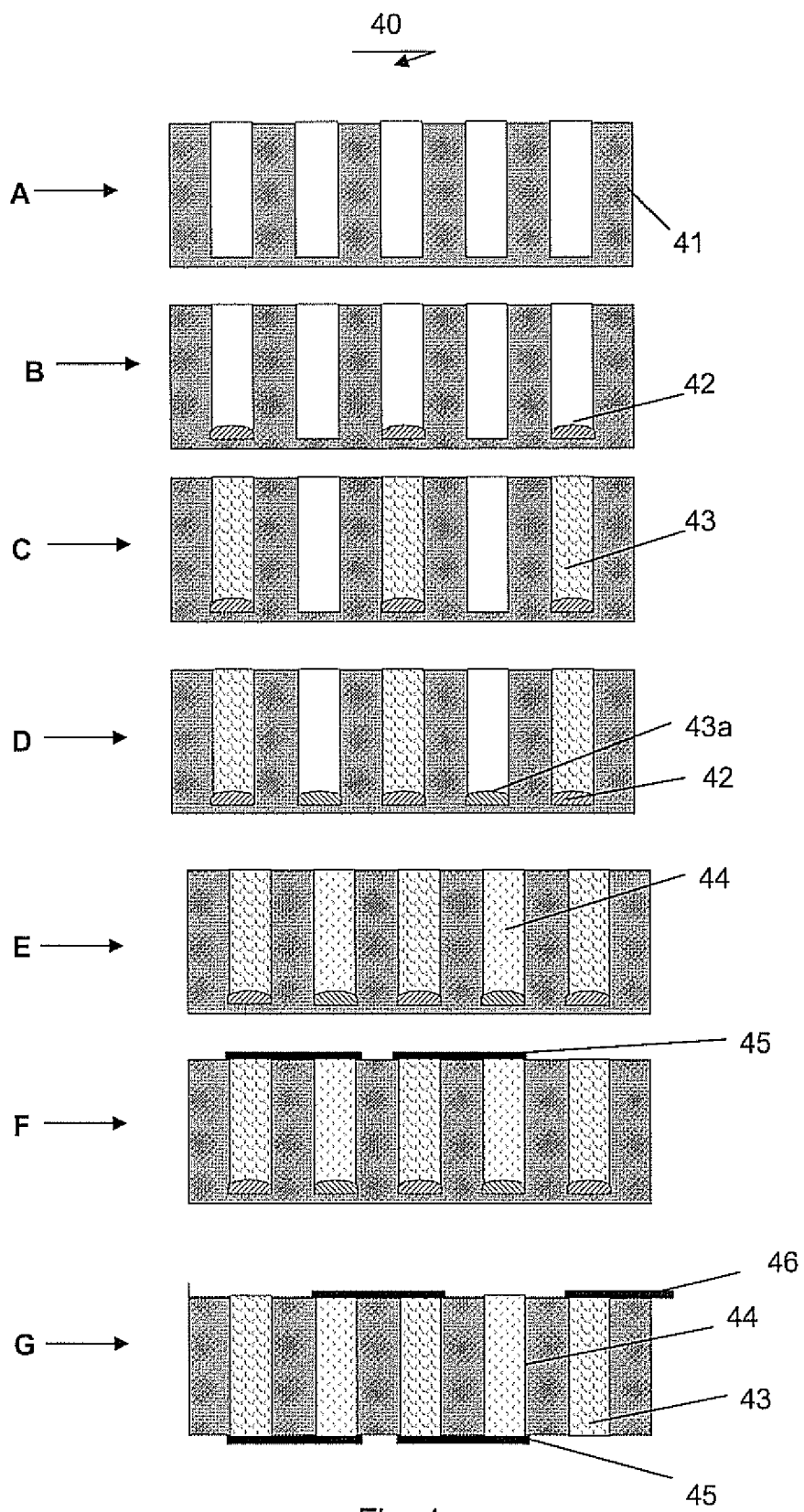
FIG. 4 presents in a schematic way a fourth embodiment of the method according to the invention.

FIG. 4 presents in a schematic way a fourth embodiment of the method 40 according to the invention. In this particular embodiment a set of cavities is provided in a suitable substrate 41 at step A. At step B, a first set of seeds 42 for a first set of cavities is deposited. These seeds act as initiator for electroless growing respective piles 43 of a thermoelectric material, see step C. At step D a second set of seeds 43a is deposited in a second set of cavities for providing initiator for growing a second set of piles 44 of a further thermoelectric material, see step E. At step F a first electrical connection 45 between piles of the type 44 and 43 is provided. At step G the sample is rotated and a second electrical connection 46 between piles of the type 44 and 43 is provided after the piles are revealed by a polishing or etching step for enabling a series connection of the thermocouples forming a thus produced thermoelectric generator. The electrical connections 45, 46 may be produced by photolithographic patterning of corresponding metal layers.

Figure 5:
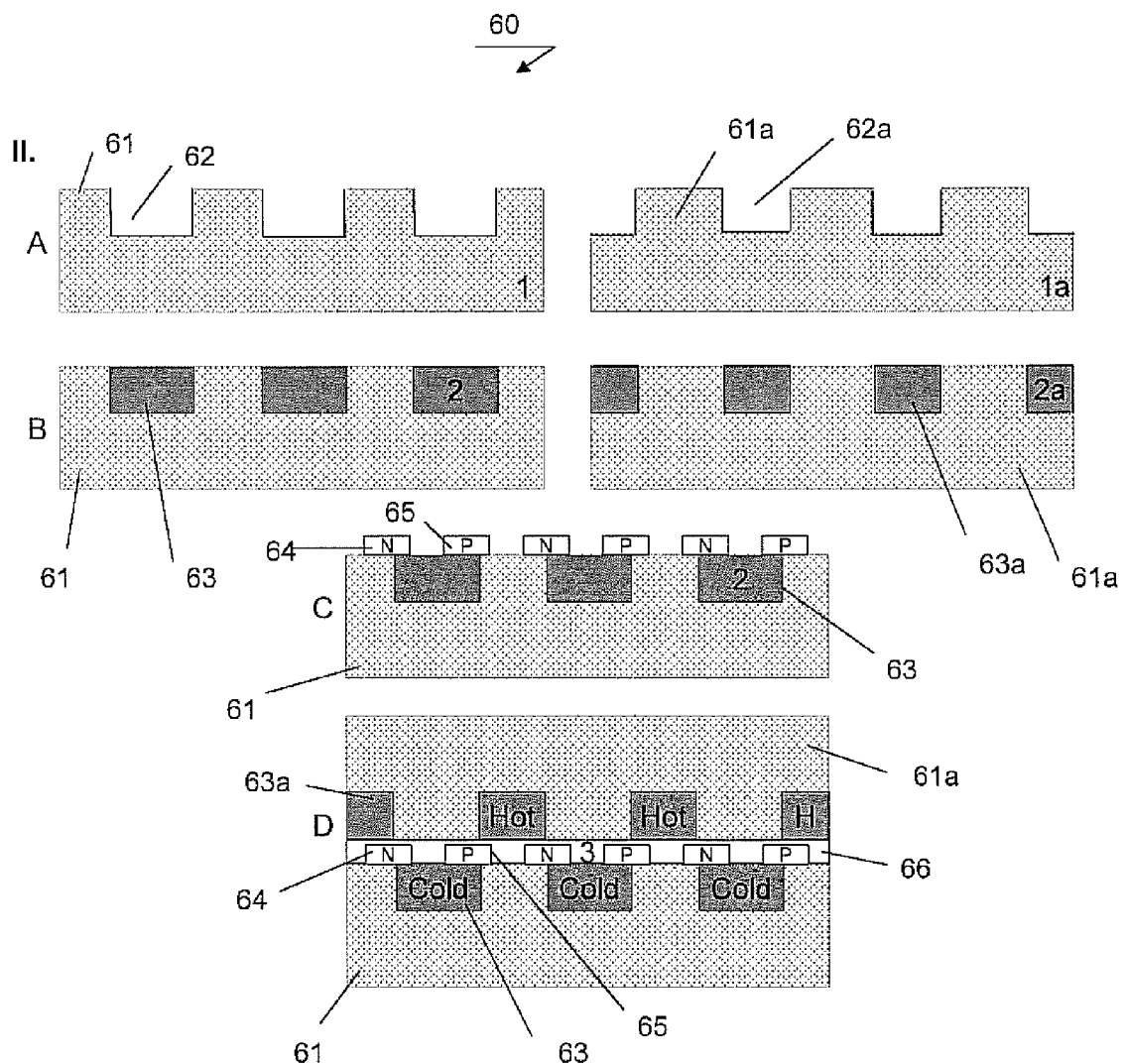
FIG. 5 presents in a schematic way a still further embodiment of the method according to the invention.

FIG. 5 presents in a schematic way a still further embodiment of the method 60 according to the invention, wherein the thermoelectric generator is provided with a hot and a cold region. At step A a substrate 61 and a substrate 61a may be replicated to provide a set of cavities 62, 62a. The substrates 61, 61a may relate to the same or to different materials. The cavities 62, 62a may be provided by replication using imprinting, hot embossing, UV curing, phase separation, or the like. At step B the cavities 62, 62a are filled with conductive material 63, 63a, for example by ink-jet printing, ink-jet printing followed by electroplating, or by electroless deposition from a seed layer. Materials 63, 63a, being identical or different, are conceived to form respective cold regions and hot regions provided to the thermoelectric generator. At step C a set of p-type 65 and n-type 64 materials, conceived to form the thermocouples, is deposited above the materials 63 of the first substrate 61. At step D the first substrate 61 is superposed and laminated with the second substrate 61a so that each thermocouple is connected to a hot region 63a and a cold region 63. For laminating a suitable laminating layer 66 may be used.

Figure 6:
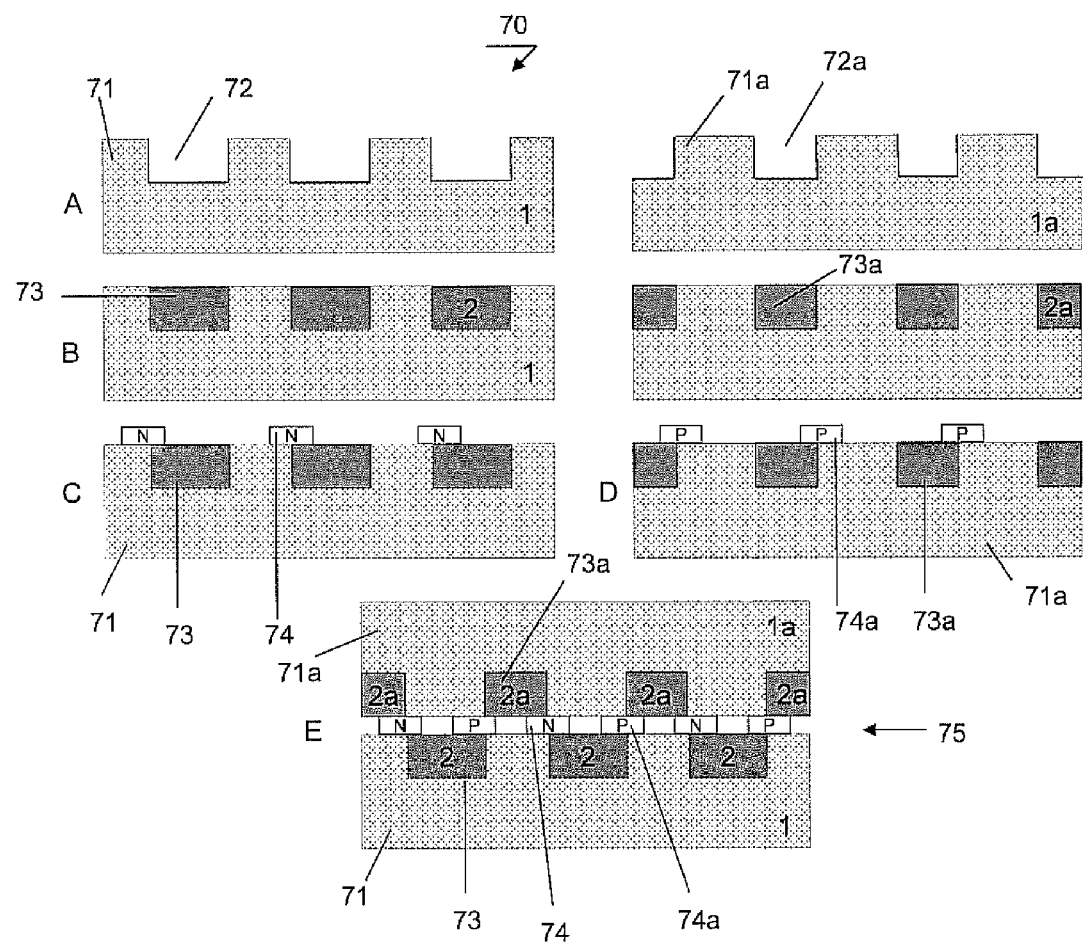
FIG. 6 presents in a schematic way a still further embodiment of the method according to the invention.

FIG. 6 presents in a schematic way a still further embodiment of the method 70 according to the invention. At step A suitable substrates 71 and 71a are structured for providing a set of cavities 72, 72a. Preferably, for structuring replication method is used, comprising imprinting, hot embossing, UV curing, phase separation, or the like. At step B the cavities 72 and 72a are filled with a conductive material 73, 73a, which may be identical or different for the first and the second substrates. Materials 73, 73a may be provided using ink-jet printing, ink-jet printing followed by electroplating, electroless deposition from a seed layer, or the like. At steps C and D the first substrate 71 and the second substrate 72 are provided with respective thermo-wires 74 being of the n-type and 74a being of the p-type, said thermo-couples being arranged in contact with respective materials 73, 73a. At step E the first substrate 71 is superposed and laminated with the second substrate 71a so that respective thermo-wires 74, 74a form thermocouples provided with hot and cold regions Preferably, material 73 provides a region of a unitary type (hot or cold) and material 73a also provides a region of a different unitary type (hot or cold). Preferably for lamination purposes a lamination layer 75 is used.

It will be appreciated that although specific embodiments of the thermoelectric generator according to the invention are discussed separately for clarity purposes, interchangeability of compatible features discussed with reference to isolated figures is envisaged. While specific embodiments have been described above, it will be appreciated that the invention may be practiced otherwise than is described. The descriptions above are intended to be illustrative, not limiting. Thus, it will be apparent to one skilled in the art that modifications may be made to the invention as described in the foregoing without departing from the scope of the claims set out below.

The invention claimed is:

1. A method for manufacturing a thermoelectric generator, comprising:
   mechanically replicating a structure into a flexible substrate for providing a set of cavities;
   providing an initiator in the cavities for growing respective piles of thermoelectric materials;
   growing the respective piles of thermoelectric materials from said initiator; and
   providing electrical connection between the respective piles of thermoelectric materials for forming thermocouples of the thermoelectric generator.

2. The method according to claim 1, wherein the step of providing the initiator comprises depositing respective metal seeds in the cavities.

3. The method according to claim 2,
   wherein depositing the respective metal seeds comprises:
      depositing first ones of the seeds in a first subset of the set of cavities, wherein the first ones of the seeds are of a first thermoelectric material; and
      depositing second ones of the seeds in a second subset of the set of cavities, wherein the second ones of the seeds are of a second thermoelectric material;
      wherein the cavities of the first subset of cavities are alternated with the cavities of the second subset of cavities.

4. The method according to claim 1, wherein the flexible substrate is a metal coated flexible substrate, and wherein the step of providing the initiator comprises removing a residual substrate material between respective cavities and the metal.

5. The method according to claim 4, wherein the metal is pre-patterned.

6. The method according to claim 1, wherein the step of mechanically replicating comprises imprinting or embossing.

7. The method according to claim 1, wherein growing the respective piles comprises either electrochemical deposition or electroless deposition.

8. The method according to claim 1, wherein the substrate comprises a polymer.

9. The method according to claim 8, wherein the polymer comprises an elastomeric material.

10. The method according to claim 8, wherein the polymer is UV curable or thermally curable.

* * * * *